(12) United States Patent
Shufflebotham

(10) Patent No.: US 8,956,888 B2
(45) Date of Patent: Feb. 17, 2015

(54) PHOTOVOLTAIC DEVICE AND METHOD AND SYSTEM FOR MAKING PHOTOVOLTAIC DEVICE

(75) Inventor: Paul Shufflebotham, San Jose, CA (US)

(73) Assignee: Apollo Precision Fujian Limited, Quanzhou (CN)

( * ) Notice: Subject to any disclaimer, the term of this patent is extended or adjusted under 35 U.S.C. 154(b) by 961 days.

(21) Appl. No.: 12/938,656

(22) Filed: Nov. 3, 2010

(65) Prior Publication Data

US 2012/0103383 A1 May 3, 2012

(51) Int. Cl.
- H01L 21/66 (2006.01)
- H01L 31/042 (2014.01)
- B32B 37/22 (2006.01)
- H01L 31/048 (2014.01)
- H01L 31/05 (2014.01)

(52) U.S. Cl.
CPC ............ *B32B 37/226* (2013.01); *H01L 31/048* (2013.01); *H01L 31/0512* (2013.01); *B32B 2457/12* (2013.01); *Y02B 10/12* (2013.01); *Y02E 10/50* (2013.01)
USPC ...................................... 438/16; 257/E21.53

(58) Field of Classification Search
None
See application file for complete search history.

(56) References Cited

U.S. PATENT DOCUMENTS

| | | | |
|---|---|---|---|
| 3,553,030 A | 1/1971 | Lebrun | |
| 5,391,235 A | 2/1995 | Inoue | |
| 5,474,621 A | 12/1995 | Barnard | |
| 5,626,688 A | 5/1997 | Probst et al. | |
| 5,814,195 A | 9/1998 | Lehan et al. | |
| 6,231,732 B1 | 5/2001 | Hollars et al. | |
| 6,365,010 B1 | 4/2002 | Hollars | |
| 6,372,538 B1 | 4/2002 | Wendt et al. | |
| 6,479,744 B1 | 11/2002 | Tsuzuki et al. | |

(Continued)

FOREIGN PATENT DOCUMENTS

| | | |
|---|---|---|
| DE | 2757301 A1 | 7/1979 |
| JP | 06021501 A | 1/1994 |

(Continued)

OTHER PUBLICATIONS

Untila et al., "19.2% Efficient Bifacial ITO-(P+Nn+)Si-ITO Laminated Grid Cell," 16th European Photovoltaic Solar Energy Conference, May 1-5, 2000, Glasgow, Scotland, pp. 1489-1491.

(Continued)

*Primary Examiner* — Seahvosh Nikmanesh
(74) *Attorney, Agent, or Firm* — The Marbury Law Group PLLC

(57) ABSTRACT

A photovoltaic device is made using a method and a system disclosed herein. The method may comprise: providing a web of photovoltaic material; providing a web of interconnect material; cutting the web of photovoltaic material into a plurality of photovoltaic cells; cutting the web of interconnect material into a plurality of interconnects; providing a respective one of the plurality of interconnects between adjacent photovoltaic cells to electrically connect a first string of photovoltaic cells in series; and laminating the first string of photovoltaic cells which are electrically connected in series between a top laminating sheet and a bottom laminating sheet. The system may comprise: a first conveyor, an optical inspection apparatus, a removal apparatus, a sorter, a second conveyor, and an assembly apparatus configured to place an interconnect between adjacent photovoltaic cells to electrically connect a first string of photovoltaic cells in series.

17 Claims, 15 Drawing Sheets

(56) References Cited

U.S. PATENT DOCUMENTS

| | | |
|---|---|---|
| 6,488,824 B1 | 12/2002 | Hollars et al. |
| 6,974,976 B2 | 12/2005 | Hollars |
| 2004/0069340 A1 | 4/2004 | Luch |
| 2005/0072461 A1 | 4/2005 | Kuchinski et al. |
| 2005/0109392 A1 | 5/2005 | Hollars |
| 2005/0176270 A1 | 8/2005 | Luch |
| 2005/0241692 A1 | 11/2005 | Rubin et al. |
| 2006/0032752 A1 | 2/2006 | Luch |
| 2006/0180195 A1 | 8/2006 | Luch |
| 2007/0283996 A1 | 12/2007 | Hachtmann et al. |
| 2007/0283997 A1 | 12/2007 | Hachtmann et al. |
| 2008/0053511 A1 | 3/2008 | Nakamura |
| 2009/0145746 A1 | 6/2009 | Hollars |
| 2009/0235979 A1* | 9/2009 | Wudu et al. .......... 136/256 |

FOREIGN PATENT DOCUMENTS

| | | |
|---|---|---|
| JP | 07099334 A | 4/1995 |
| JP | 10093125 A | 4/1998 |
| WO | 2009117233 A2 | 2/2009 |

OTHER PUBLICATIONS

Richards et al., "Enhancing the Efficiency of Production CdS/CdTe PV Modules by Overcoming Poor Spectral Response at Short Wavelengths via Luminescence Down-Shifting," 2006 IEEE 4th World Conference on Photovoltaic Energy Conversion, May 7-12, 2006, 4pgs.

* cited by examiner

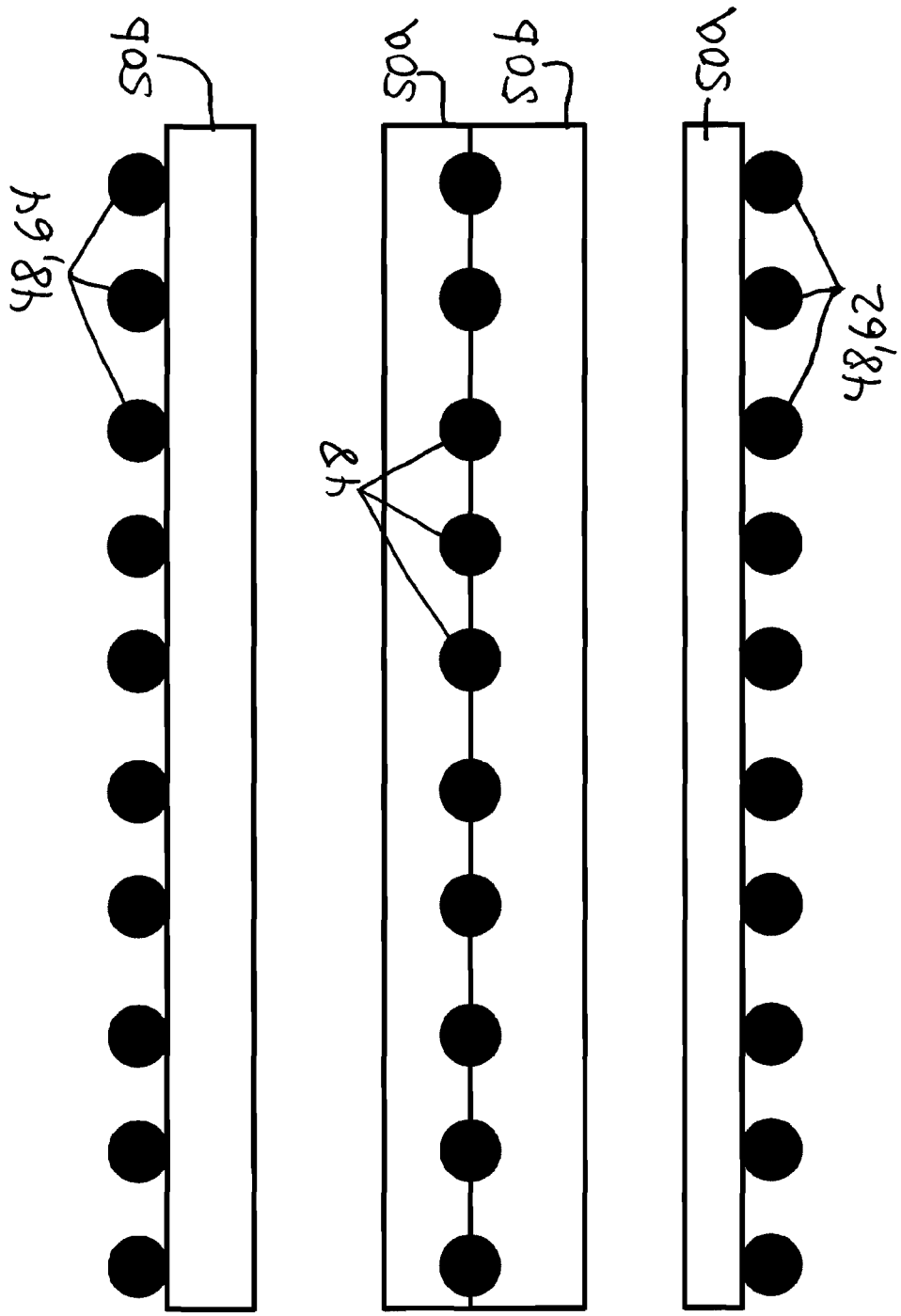

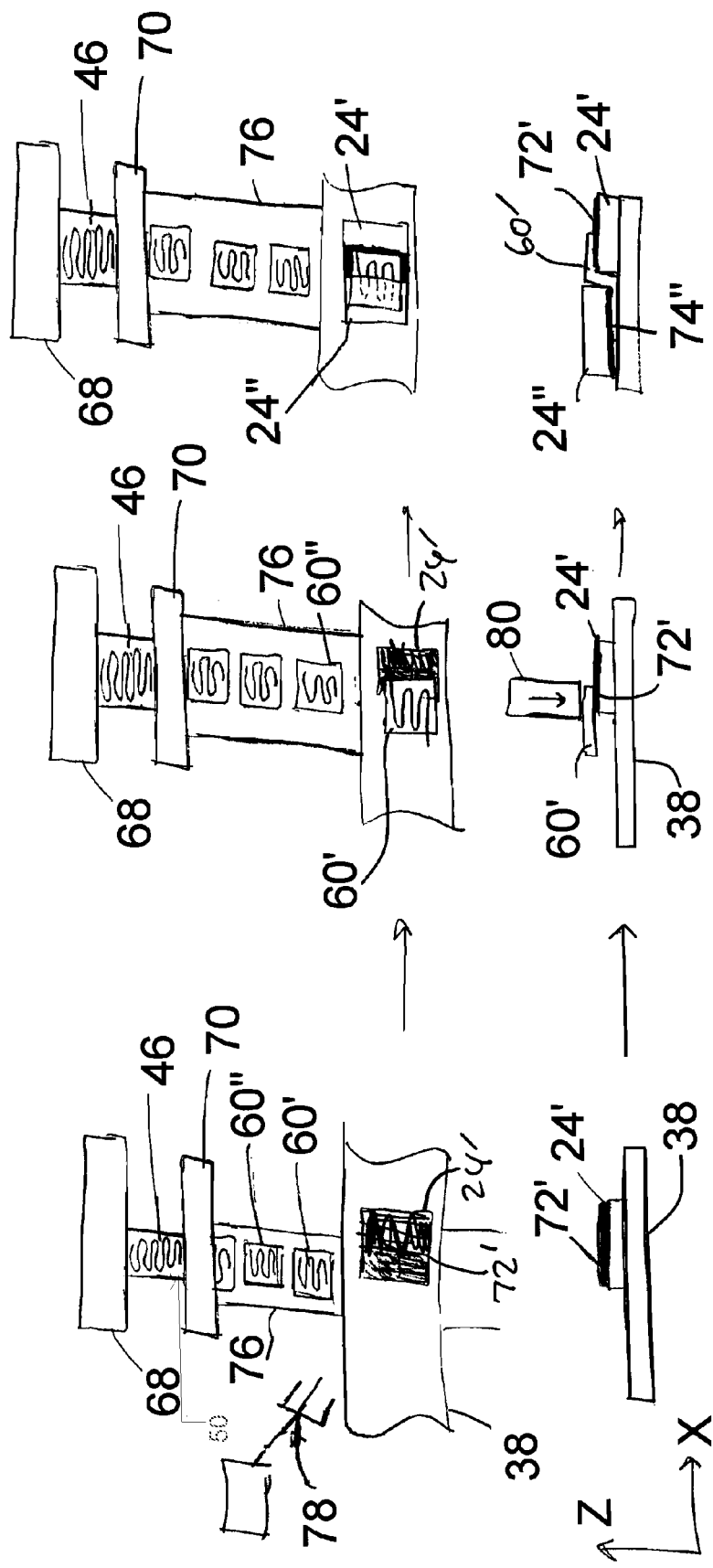

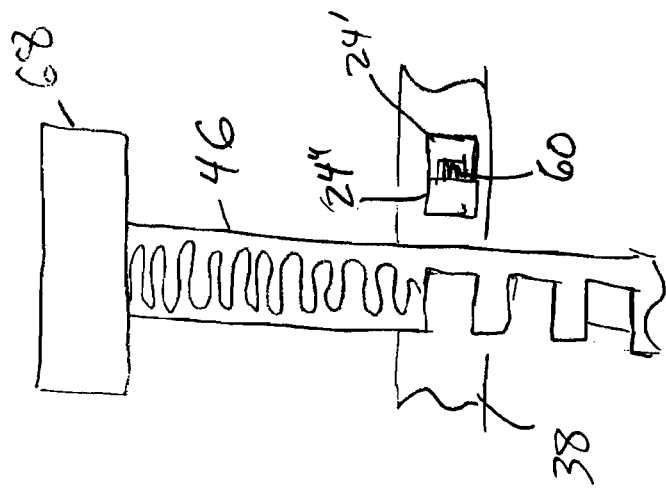
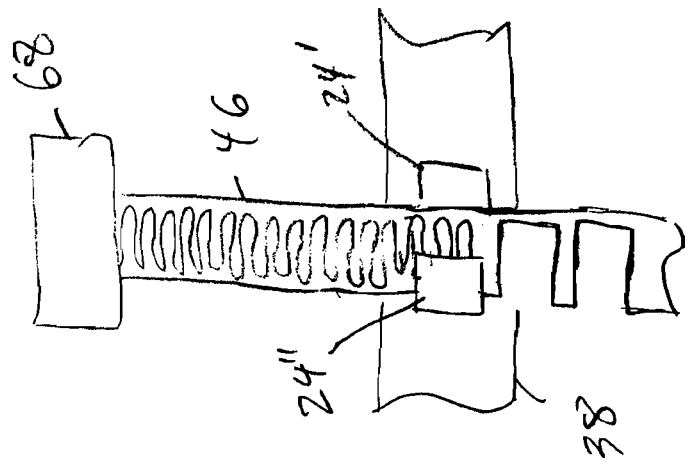
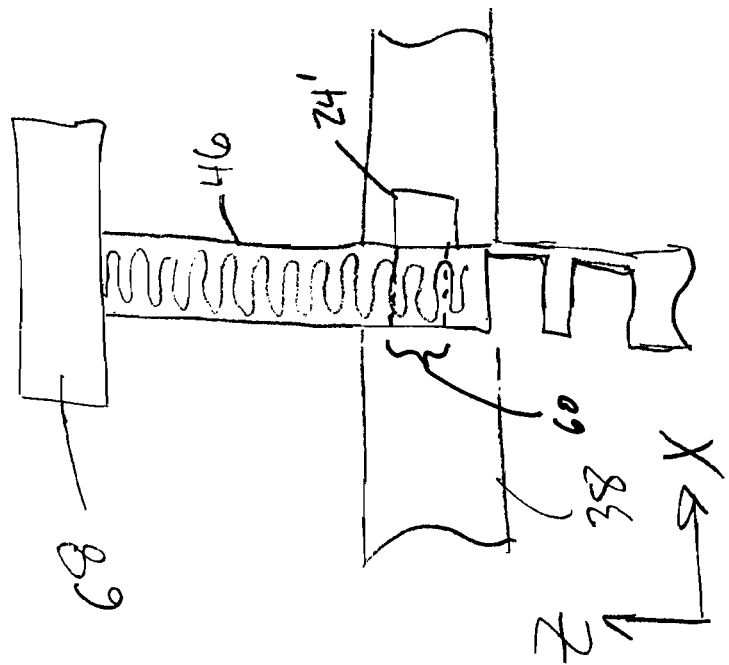

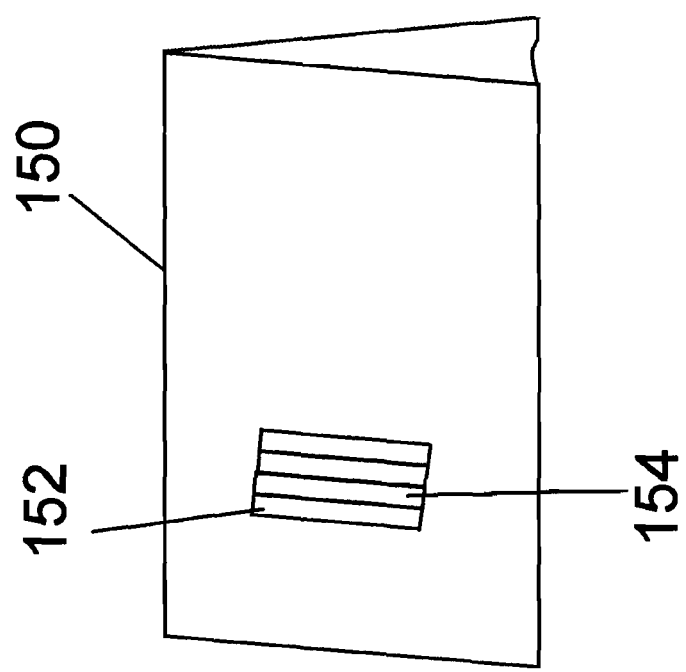

PHOTOVOLTAIC DEVICE AND METHOD AND SYSTEM FOR MAKING PHOTOVOLTAIC DEVICE

BACKGROUND

The present invention relates to a photovoltaic device, a method and a system for making the photovoltaic device, and a method of installing the photovoltaic device.

Many commercial photovoltaic ("PV") modules are passive devices configured with a fixed arrangement of cells, interconnections and output characteristics. Cell to cell interconnections in such devices are made using a tab and string method by soldering copper strips between adjacent cells. Furthermore, many commercial photovoltaic modules are plagued with limitations relating to their manufacture, installation and operation.

In the case of providing strings of photovoltaic cells, such as those used to make solar cells, it is desired to remove defective materials without leaving gaps in the final rolls.

SUMMARY

According to one embodiment of the present invention, a method of making a photovoltaic device may comprise: providing a web of photovoltaic material; providing a web of interconnect material comprising a conductor supported by an insulating carrier; cutting the web of photovoltaic material into a plurality of photovoltaic cells; cutting the web of interconnect material into a plurality of interconnects; providing a respective one of the plurality of interconnects between adjacent photovoltaic cells to electrically connect a first string of photovoltaic cells in series; and laminating the first string of photovoltaic cells which are electrically connected in series between a top laminating sheet and a bottom laminating sheet.

According to another embodiment of the present invention, a system for making a flexible photovoltaic device may comprise: a first conveyor configured to convey a plurality of flexible photovoltaic cells along a first section of the system; an optical inspection apparatus located adjacent to the first conveyor, the optical inspection apparatus configured to inspect the plurality of photovoltaic cells and to determine if the photovoltaic cells are within a predetermined level of suitability; a removal apparatus configured to remove unsuitable photovoltaic cells from the first conveyor if the photovoltaic cells are not within the predetermined level of suitability; a sorter located at an output end of the first conveyor and configured to stack the plurality of photovoltaic cells; a second conveyor located at an output end of the sorter, the second conveyor configured to convey the plurality of photovoltaic cells along a second section of the system; and an assembly apparatus configured to place an interconnect between adjacent photovoltaic cells to electrically connect a first string of photovoltaic cells in series.

According to another embodiment of the present invention, a method of making a photovoltaic device may comprise: optically inspecting a plurality of moving photovoltaic cells to determine if the photovoltaic cells are within a predetermined level of suitability; removing unsuitable photovoltaic cells which do not meet the predetermined level of suitability; and reintegrating the plurality of remaining photovoltaic cells after removing the unsuitable photovoltaic cells such that the plurality of the remaining photovoltaic cells are moving while being spaced apart from each other.

According to another embodiment of the present invention, a method of installing a flexible photovoltaic device may comprise: providing a flexible photovoltaic device roll comprising at least a first string of photovoltaic cells which are electrically connected in series and a second string of photovoltaic cells which are electrically connected in series between a top laminating sheet and a bottom laminating sheet such that the top laminating sheet contacts the bottom laminating sheet in a space between the first and the second strings of photovoltaic cells; unrolling the flexible photovoltaic device roll; cutting the unrolled flexible photovoltaic device roll in the space between the first and the second string; installing the first string laminated between the top and bottom laminated sheets in a first location; and separately installing the second string laminated between the top and bottom laminated sheets in a second location.

According to another embodiment of the present invention, a photovoltaic device may comprise a flexible photovoltaic device roll comprising at least a first string of photovoltaic cells which are electrically connected in series and a second string of photovoltaic cells which are electrically connected in series between a top laminating sheet and a bottom laminating sheet such that the top laminating sheet contacts the bottom laminating sheet in a space between the first and the second strings of photovoltaic cells.

It is to be understood that both the foregoing general description and the following detailed description are exemplary and explanatory only, and are not restrictive of the invention as claimed.

BRIEF DESCRIPTION OF THE DRAWINGS

The features, aspects, and advantages of the present invention will become apparent from the following description, appended claims, and the accompanying exemplary embodiments shown in the drawings, which are briefly described below.

FIGS. 5(a)-5(d) show the side cross sectional views of the interconnect of FIG. 4 along lines A-A, B-B, C-C and D-D respectively.

FIGS. 7(a)-7(c) show top and side views of the process where interconnects are provided between adjacent photovoltaic cells.

FIGS. 14(a)-14(c) are schematic diagrams showing the operation of a portion the system for making a photovoltaic device according to another embodiment of the present invention.

FIG. 15 is a schematic diagram showing the installation of the photovoltaic device according to an embodiment of the present invention.

DETAILED DESCRIPTION

Figure 1:
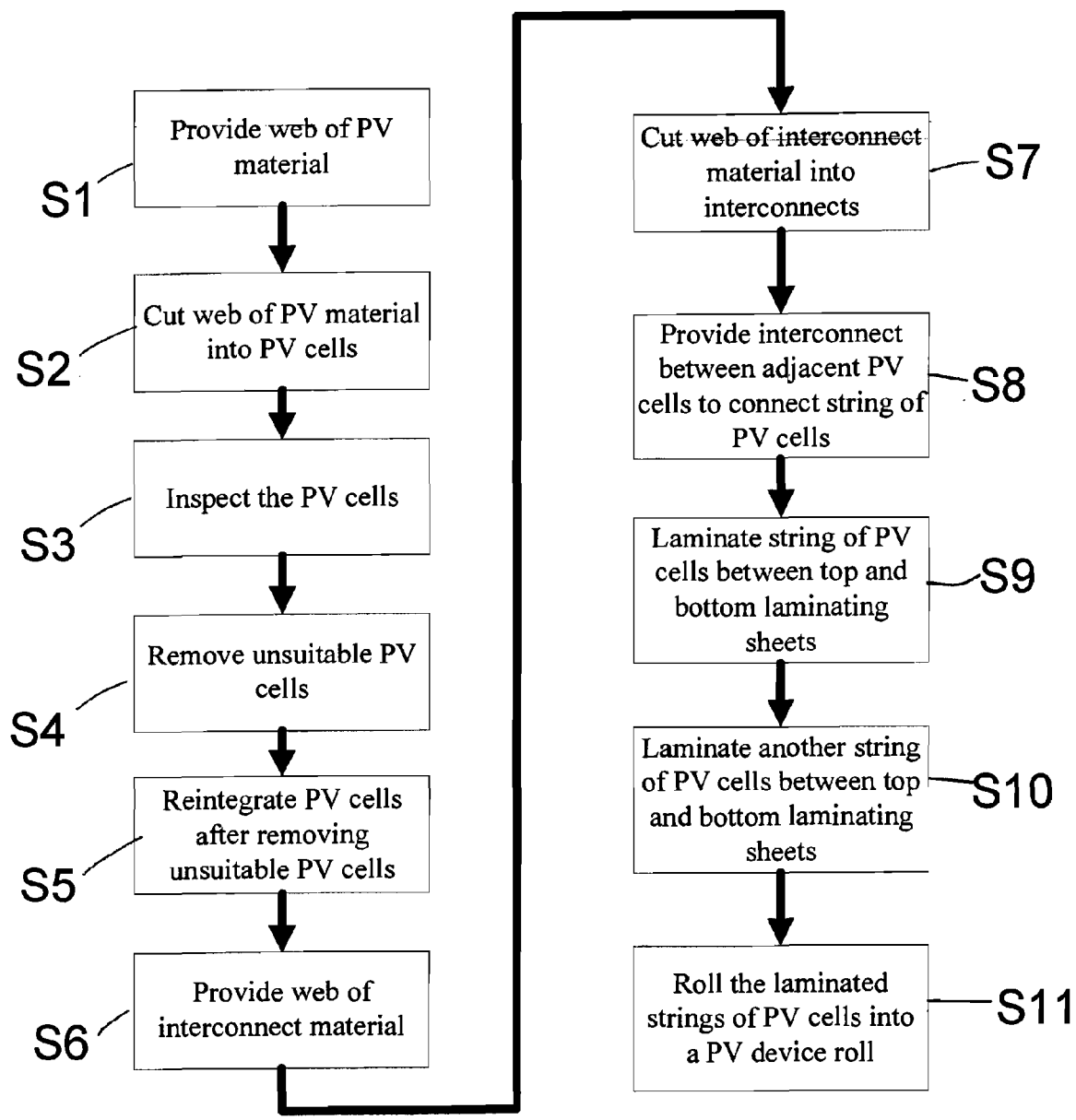
FIG. 1 is a flow chart showing a process for making a photovoltaic device according to one embodiment of the present invention.
Figure 2:
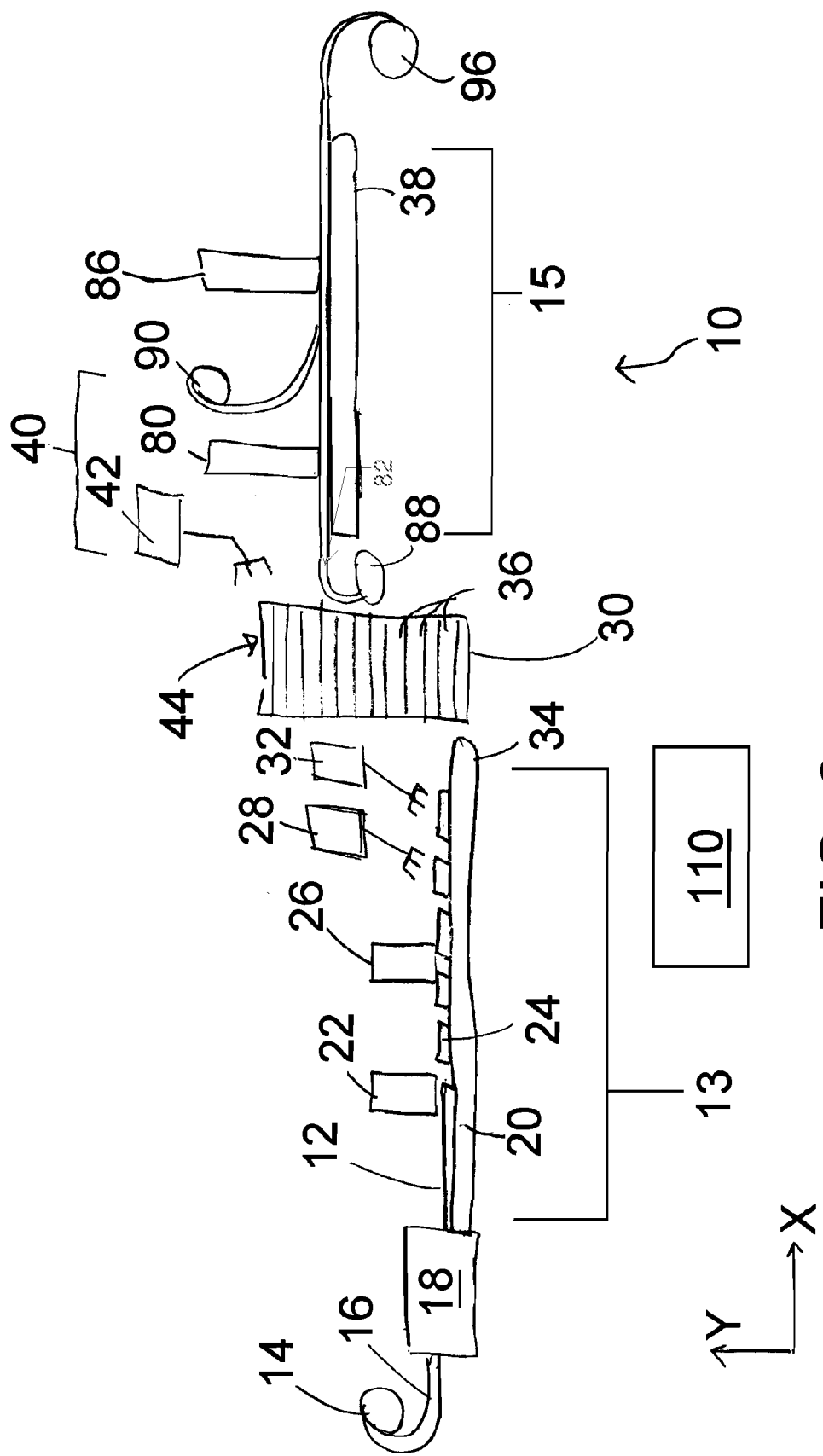
FIG. 2 is a schematic side view diagram of the system for making a photovoltaic device according to one embodiment of the present invention.

FIG. 1 shows a flow chart showing the process for making a photovoltaic ("PV") device while FIG. 2 shows the system 10 used for making the PV device. The process or method may comprise the step of providing a web of photovoltaic material 12 in step S1. To provide the web of photovoltaic material 12, a substrate web spool 14 is configured to provide a flexible substrate web 16 into at least one photovoltaic material deposition chamber 18. At least one photovoltaic material deposition chamber 18 is located between the substrate web spool 14 and an input end of a first conveyor 20. P-type and n-type photovoltaic material and at least one electrode are deposited onto the moving substrate web 16 in the deposition chamber 18. More than one deposition chamber may be used, such as, for example, two, three, or more deposition chambers. In one non-limiting embodiment, to form the web of photovoltaic material 12, a roll of flexible substrate web 16 may be unrolled from a spool 14 in an input module. The substrate web 16 may comprise any suitable substrate material, such as plastic, metal (e.g., steel, titanium, aluminum, etc.), etc. The flexible substrate web 16 is provided into at least one deposition chamber 18 (e.g., plural chambers 18-18 for example) to form the PV web 12. The number of deposition chambers or process modules 18 may be varied to match the requirements of the device that is being produced. Each module has a pumping device, such as vacuum pump, for example a high throughput turbomolecular pump, to provide the required vacuum and to handle the flow of process gases during the sputtering operation. The modules may be connected together at slit valves which contain very narrow low conductance isolation slots to prevent process gases from mixing between modules. These slots may be separately pumped if required to increase the isolation even further. Other module connectors may also be used. Alternatively, a single large chamber may be internally segregated to effectively provide the module regions, if desired. Each respective sputtering chamber may be used to deposit at least one layer of the PV web 12. For example, the first chamber containing one or more sputtering targets may be used to deposit a bottom electrode, such as a molybdenum or its alloy layer, over the substrate web 16. The second chamber containing one or more sputtering targets may be used to deposit at least one absorber layer, such as a p-type copper indium gallium selenide (CIGS) layer over the bottom electrode layer. The third chamber containing one or more sputtering targets may be used to deposit at least one window layer, such as a n-type CdS layer, over the absorber layer. The fourth chamber containing one or more sputtering targets may be used to deposit least one transparent conductive upper electrode layer, such as a transparent conductive oxide, for example, zinc oxide, aluminum zinc oxide, and/or indium tin oxide, etc., over the window layer, as described in U.S. Pat. No. 7,544,884 and U.S. application Ser. No. 12/379,428 filed Feb. 20, 2009, incorporated herein by reference in their entirety. The upper surface of the PV web 12 comprises the conductive material of the one of the electrodes (e.g., the upper transparent electrode) of the PV cells that will formed when the web 12 is cut into PV cells. Other PV materials, such as silicon, CdTe, III-V materials, etc. may be used instead of CIGS and CdS. The web substrate 16 may be moved throughout the chamber(s) 18 by rollers or other devices. Each chamber may include a back side heater for heating the substrate 16. Deposition methods other than sputtering, such as CVD, plating, evaporation, etc. may also be used to deposit one or more layers. A rigid or semi-rigid substrate may be used instead of the flexible substrate web 16.

The web of photovoltaic material 12 resulting from the deposition process is then placed on the first conveyor 20 which is configured to convey the web of photovoltaic material 12 along a first section of the system 13. In step S2, the web of photovoltaic material 12 is cut into a plurality of photovoltaic cells 24 using a cutting device 22. In particular, the web of photovoltaic material 12 from the one or more deposition chambers 18 is moved in a first direction X using the first conveyor 20 and/or tension rollers, such that the step of cutting the web of photovoltaic material 12 comprises cutting the moving web of photovoltaic material 12 into the plurality of photovoltaic cells 24 using the cutting device 22. The cutting device may be have any suitable cutting implement such as a blade with a cutting edge, a punch and die set, or the like. Alternatively, the web 12 may be cut into PV cells 24 prior to being placed onto the conveyor 20. In this case, the PV cells 24 are placed onto the conveyor 20 after being cut from the PV web 12.

In step S3, after cutting the web of photovoltaic material 12 into a plurality of cells 24, the plurality of moving photovoltaic cells 24 on conveyor 20 are inspected by an inspection apparatus 26. The inspection apparatus 26 may be an optical inspection apparatus located adjacent to the first conveyor 20. The optical inspection apparatus is configured to optically inspect the plurality of photovoltaic cells 24 located on the moving conveyor 20 and to determine if the photovoltaic cells are within a predetermined level of suitability. An example of an optical inspection apparatus may comprise any suitable camera or image capturing device and a processor storing a comparison algorithm which compares the captured image with a predetermined image. If the comparison between the two images is within a predetermined tolerance, the photovoltaic cell will be considered suitable. If the comparison is outside a predetermined tolerance, the photovoltaic cell will be considered unsuitable. Such comparison algorithms are known in the art.

In step S4, if it is determined that a photovoltaic cell 24 is not within the predetermined level of suitability, it is removed from the first conveyor 20 using a removal apparatus 28. The removal apparatus may be, for example, a robotic arm with a vacuum head or opposing "fingers" for grabbing the unsuitable cells, a slide tray, a push bar and/or any other suitable mechanical device which may remove unsuitable cells 24 from the conveyor 20.

In step S5, the plurality of photovoltaic cells 24 that are determined by the inspection apparatus 26 to be suitable are reintegrated after removing the unsuitable photovoltaic cells such that the plurality of remaining photovoltaic cells are moving while being spaced apart (e.g., equidistant or non-equidistant) from each other. The reintegration of the photovoltaic cells 24 may be carried out by individually stacking the plurality of suitable photovoltaic cells 24 into a sorter 30. The mechanism for placing or stacking the photovoltaic cells 24 into the sorter 30 may be the removal apparatus 28 or a separate placement apparatus 32 that may be similar or different in nature from the removal apparatus 28. For example, the placement apparatus 32 may grab the photovoltaic cells 24 using a vacuum head or opposing fingers and place the cells 24 on the shelves of the sorter 30. Alternatively, the apparatus 32 may comprise a push bar and/or a slide tray.

The sorter 30 may be located at an output end 34 of the first conveyor 20 and configured to stack the plurality of photovoltaic cells 24. The sorter 30 may comprise a stack of shelves 36 configured to receive each photovoltaic cell on a corresponding shelf 36 and each shelf in the stack of shelves is configured to move in a vertical direction Y from the first conveyor 20 to the second conveyor 38. Alternatively or additionally, the sorter 30 may comprise at least one shelf 36 (or a plurality of shelves) on which a plurality of photovoltaic cells 24 are stacked on top of each other (as opposed to one photovoltaic cell per shelf) and the at least one shelf 36 is configured to move in the vertical direction Y from the first conveyor 20 to the second conveyor 38. While the second conveyor 38 is shown as being located above the first conveyor 20, the second conveyor 38 may also be located below and/or to the side of the first conveyor 20.

The individual photovoltaic cells 24 are provided from the sorter 30 onto the second conveyor 38 such that the plurality of photovoltaic cells 24 are spaced apart (e.g., equidistant or non-equidistant) from each other on the second conveyor 38 using an assembly apparatus 40. In particular, at least one first robotic arm 42 of the assembly apparatus 40 is configured to place the photovoltaic cells 24 from the sorter 30 onto the second conveyor 38 such that the plurality of photovoltaic cells 24 are spaced apart from each other on the second conveyor 38. The at least one robotic arm 42 may have a vacuum head or opposing fingers for picking up and transferring the photovoltaic cells 24. Alternatively, the assembly apparatus may comprise a push bar, a slide tray or any other suitable transfer mechanism. The second conveyor 38 is then located at an output end 44 of the sorter 30, moves in the first direction X, and is configured to convey the plurality of photovoltaic cells 24 along a second section of the system 15. A bottom laminating sheet 82 is provided on the second conveyor 38 from spool 88. In this step, the bottom laminating sheet 82 and/or web from a first laminating spool or roll 88 is provided on the second conveyor 38 such that it will be located under the plurality of photovoltaic cells 24.

Figure 3:
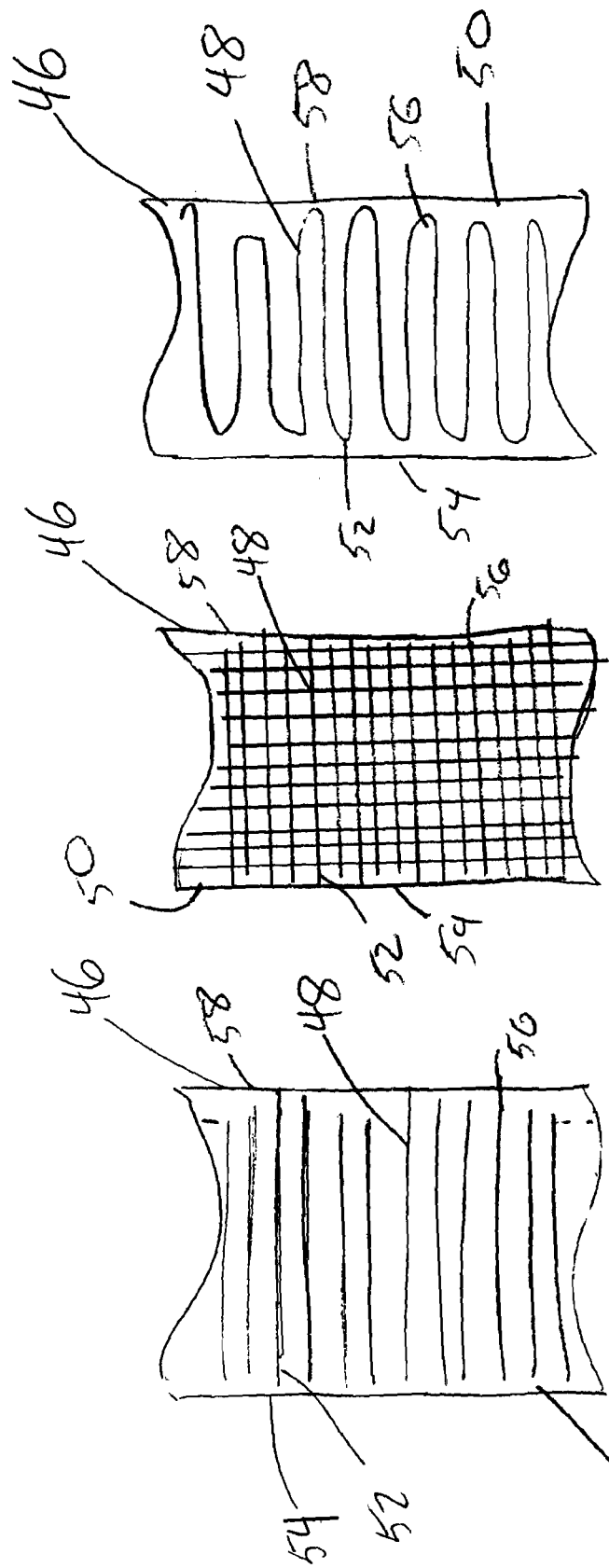
FIGS. 3(a)-3(c) show top views of different embodiments of the web of interconnect material according to the present invention.

In step S6, a web of interconnect material 46 is provided. As seen in FIGS. 3(a)-3(c), the web of interconnect material 46 may comprise a conductor 48 supported by an insulating carrier 50. According to one embodiment, the conductor 48 comprises a conductive wire. A web, strip or piece of the insulating carrier 50 supports the conductive wire 48.

FIG. 3(a)-3(c) show different embodiments of the conductive wire for the web of interconnect material. The conductive wire 48 may comprise, for example, a plurality of repeating, discrete wire segments which are separated from each other in a movement direction of the insulating carrier web as shown in FIG. 3(a). A first end 52 of each wire segment is located adjacent to a first edge 54 of the insulating carrier web, strip or piece 50 and a second end 56 of each wire segment is located adjacent to a second edge 58 of the insulating carrier web, strip or piece 50. Alternatively a wire mesh 48 shown in FIG. 3(b) or a continuous serpentine wire 48 shown in FIG. 3(c) may be used instead of the discrete wire segments of FIG. 3(a).

After being cut (described below), the resulting interconnect 60 (shown in FIG. 4 and FIGS. 5(a)-5(d)), may comprise one of the plurality of repeating, discrete wire segments in which each wire segment has a leading portion 62 and a trailing portion 64. The leading portion 62 of the wire segment is exposed below a bottom surface of the insulating carrier web, strip or piece while the trailing portion 64 of the wire segment is exposed above a top surface of the insulating carrier web, strip or piece 50. Each wire segment may comprise a plurality of straight wires (FIG. 3(a)), a wire mesh (FIG. 3(b)), one or more curved or serpentine wires (FIG. 3(c)), or any suitable configuration. FIGS. 3(a)-(c) and 4 show a top view of the conductors as they would be embedded in the insulating carrier web. For example, the embodiment of FIGS. 4 and 5(a) to 5(d) show that each wire 48 comprises a continuous serpentine wire which extends a plurality of times from the bottom surface to the top surface of the insulating carrier web, strip or piece through the insulating carrier web, strip or piece 50. If desired, in order for the leading portion 62 of the wire 48 to be exposed below a bottom surface of the insulating carrier web, strip or piece 50 while the trailing portion 64 of the wire 48 to exposed above a top surface of the insulating carrier web, strip or piece 50, the insulating web, strip or piece 50 may comprise two joined portions 50a and 50b. The first or leading portion 50a of insulator 50 is located above the leading portion 62 of the wire 48 and the second or trailing portion 50b of insulator 50 is located below the trailing portion 64 of the wire 48. The first and second portions 50a, 50b of the insulator 50 are joined by adhesion, pressing, etc, in between the wire(s) 48, as described in U.S. application Ser. No. 12/052,476 filed on Mar. 20, 2008 and incorporated herein by reference in its entirety.

Figure 6A:
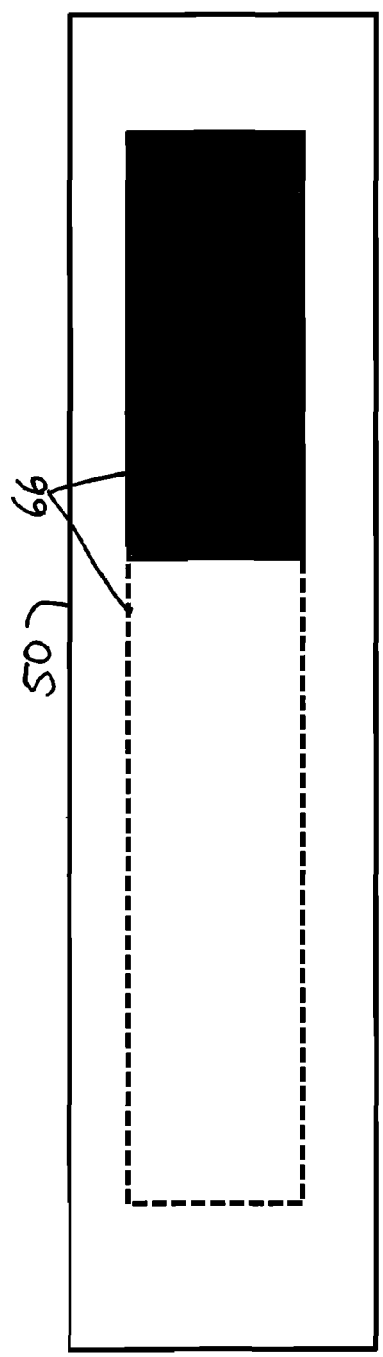
FIGS. 6(a) and 6(b) show top and side cross sectional views, respectively, of an interconnect with a printed or plated trace electrode according to another embodiment of the present invention.
Figure 6B:
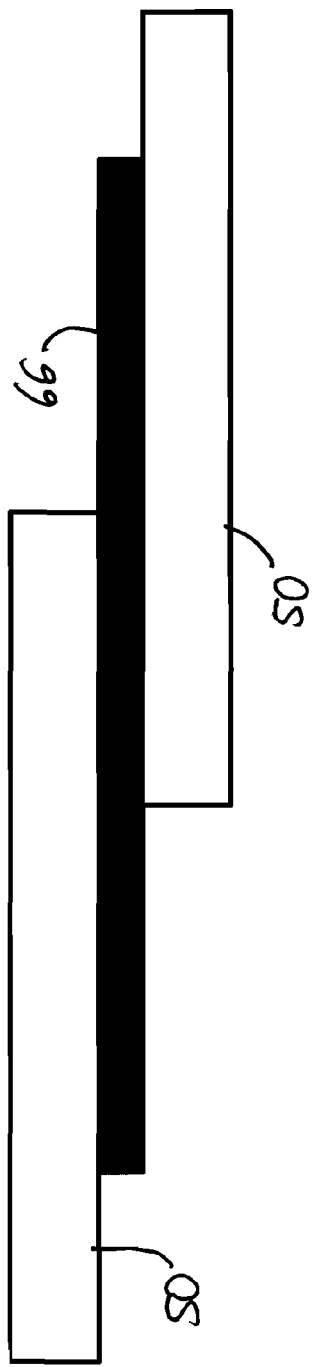

According to another embodiment, the conductor 48 of the interconnect may comprise a printed or plated trace electrode 66 as seen in FIGS. 6(a) and 6(b). FIG. 6(a) shows a top view of the electrode 66 as it would be embedded in the insulating carrier web, strip or piece 50.

If an insulating carrier web 50 is used, then the web of interconnect material 46 dispensed from an interconnect spool 68 which is configured to hold a roll of interconnect material 46 comprising the flexible conductive wire 48 or trace supported by the insulating carrier web 50, as seen in FIGS. 7(a)-7(c). The interconnect spool 68 is positioned to provide the insulating carrier web 50 in a direction Z substantially perpendicular to the movement direction X of the second conveyor 38. The web of interconnect material 46 is moved in the second direction Z which is substantially perpendicular to the first direction X (i.e., the direction that the first photovoltaic cells located on the second conveyor moves) by unrolling the web of interconnect material 46 from the interconnect spool or roll 68 in the second direction Z.

In step S7, the web of interconnect material 46 is cut into a plurality of interconnects 60 using a cutting device 70. The cutting device 70 is positioned adjacent to the second conveyor 38 and is configured to cut interconnects 60 from the roll of interconnect material 46 such that the interconnect 60 can be placed on a photovoltaic cell 24 located on the second conveyor 38. The cutting device 70 may be have any suitable cutting device such as a blade with a cutting edge, a punch and die set, or the like. The step of cutting the web of interconnect material 46 forms a first interconnect 60' which, for example, may have the leading portion of the wire segment capable of contacting an upper electrode 72' of the first photovoltaic cell 24' located on the second conveyor 38. A third conveyor 76 may be provided to deliver the interconnects 60 to the assembly apparatus.

In step S8, the interconnects are provided between adjacent photovoltaic cells 24 to electrically connect a string of photovoltaic cells 92 in series using an assembly apparatus configured to place interconnects between adjacent photovoltaic cells. A robotic arm 78 of the assembly apparatus 40 may be configured to take the interconnects from the third conveyer 76 and place them onto the photovoltaic cells 24' such that the leading portion of the wire segment contacts the upper electrode 72' of the photovoltaic cell located on the second conveyor 38. Alternatively, another robotic arm, different from the robotic arm 78, may be used to place the interconnects between the adjacent photovoltaic cells.

Figure 8:
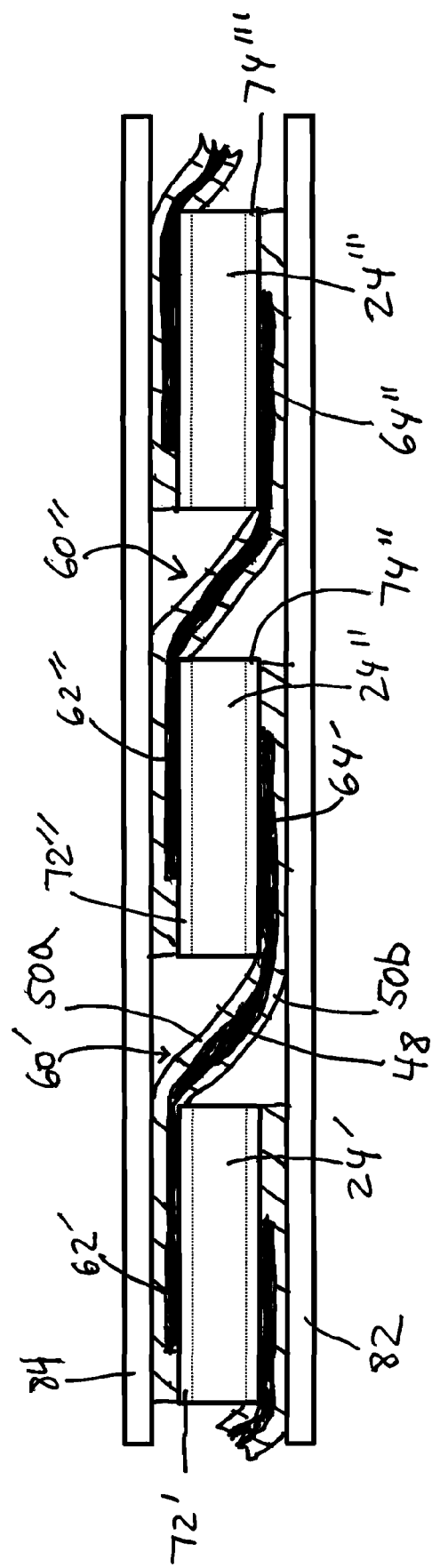
FIG. 8 is a partial side cross sectional view of a string of photovoltaic cells formed by the process of FIGS. 7(a)-7(c).

FIGS. 7(a)-7(c) show that step S8 may comprise the following sub-steps: placing a first photovoltaic cell 24' on the second conveyor 38; placing a first interconnect 60' such that the conductor of the first interconnect 60' contacts an upper electrode 72' of the first photovoltaic cell 24' located on the second conveyor 38 shown in FIG. 7(a); pressing the first interconnect 60' against the first photovoltaic cell 24' using, for example, a pressing machine 80 shown in FIG. 7(b) and/or the robotic arm 78 shown in FIG. 7(a); and placing a second photovoltaic cell 24" onto the first interconnect 60' such that the conductor of the first interconnect 60' contacts a lower electrode 74" of the second photovoltaic cell 24" shown in FIG. 7(c). If a thermoplastic adhesive is used, then heat may also be applied in addition to the pressing step described above to activate the adhesive. As shown in FIG. 8, the interconnect 60 is placed on top of the first PV cell 24' using arm 78 (shown in FIG. 7(a)) such that the wire 48 (or trace) exposed on the bottom of the leading portion 50a of the insulator 50 contacts the top electrode of the first PV cell 24' and such that the trailing portion of the interconnect 60 hangs off the first PV cell 24'. The second PV cell 24" is then placed on the trailing portion of the interconnect such that the exposed wire 48 (or trace) exposed on the top of the trailing portion 50b of the insulator 50 contacts the bottom electrode of the second PV cell 24". Thus, the wire 48 (or trace) interconnects the top electrode of the first PV cell 24' with the bottom electrode of the second PV cell 24".

Figure 4:
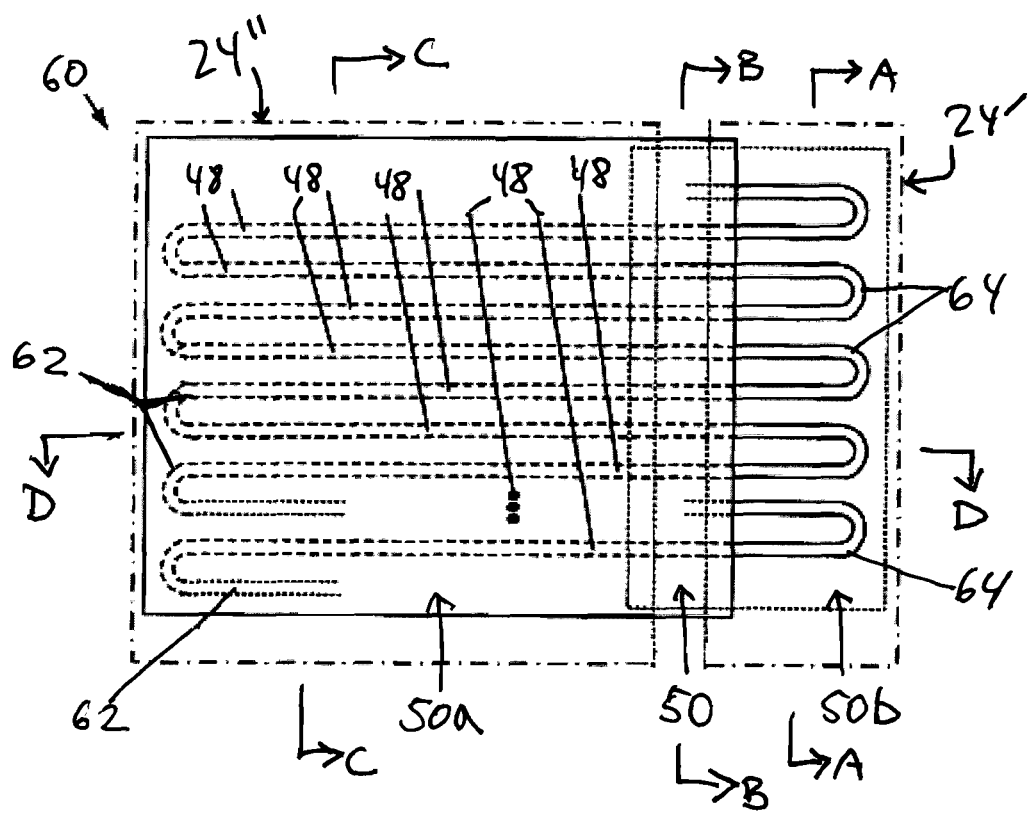
FIG. 4 shows a top view of an embodiment of the interconnect formed from the interconnect material web of FIG. 3(c).
Figure 5D:
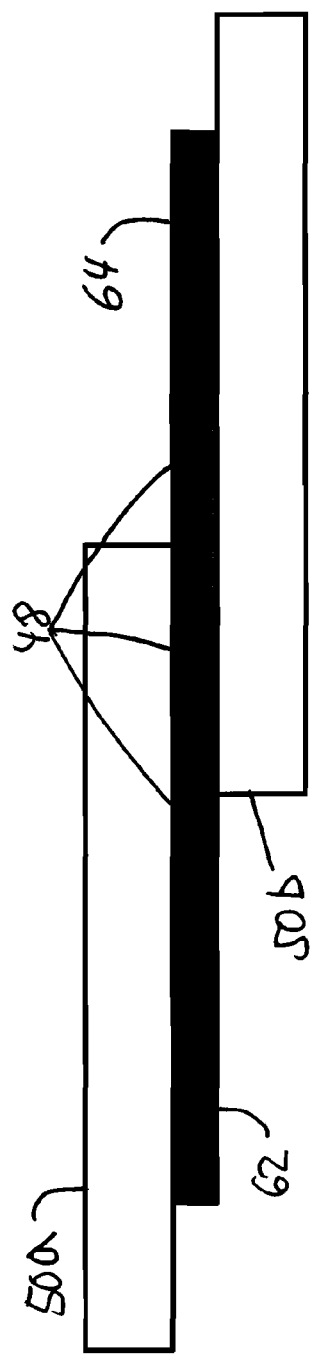

According to one embodiment of the present invention, if one of the types of interconnects of FIG. 4 is being provided between adjacent photovoltaic cells, the assembly of FIG. 8 would result in which a first photovoltaic cell 24' was provided on a bottom (or first) laminating sheet 82 disposed on the second conveyer 38. A first interconnect 60' is placed such that the leading portion 62' of the wire segment of the first interconnect 60' contacts an upper electrode 72' of the first photovoltaic cell 24' (where cell 24' is located on the bottom laminating sheet 82). Next, a second photovoltaic cell 24" is placed onto the trailing portion 64' of the wire segment of the first interconnect 60' such that the trailing portion 64' contacts a lower electrode 74" of the second photovoltaic cell 24".

The process of FIGS. 7(a)-7(c) can be repeated in which a second interconnect 60" is placed such that the conductor of the second interconnect 60" contacts an upper electrode 72" of the second photovoltaic cell 24" located on the second conveyor 38; pressing the second interconnect 60" against the second photovoltaic cell 24" using a pressing machine 80 (shown in FIG. 7(b) and/or the robotic arm 78 (shown in FIG. 7(a)); and placing a third second photovoltaic cell 24" onto the second interconnect 60" such that the conductor of the second interconnect 60" contacts a lower electrode 74" of the third photovoltaic cell 24". The process of FIGS. 7(a)-7(c) may be repeated a predetermined number of times, such as 2, 5, 10, 20, 50, 100 or more or any integer therebetween such that a string of photovoltaic cells is formed as shown in FIG. 8.

Figure 9:
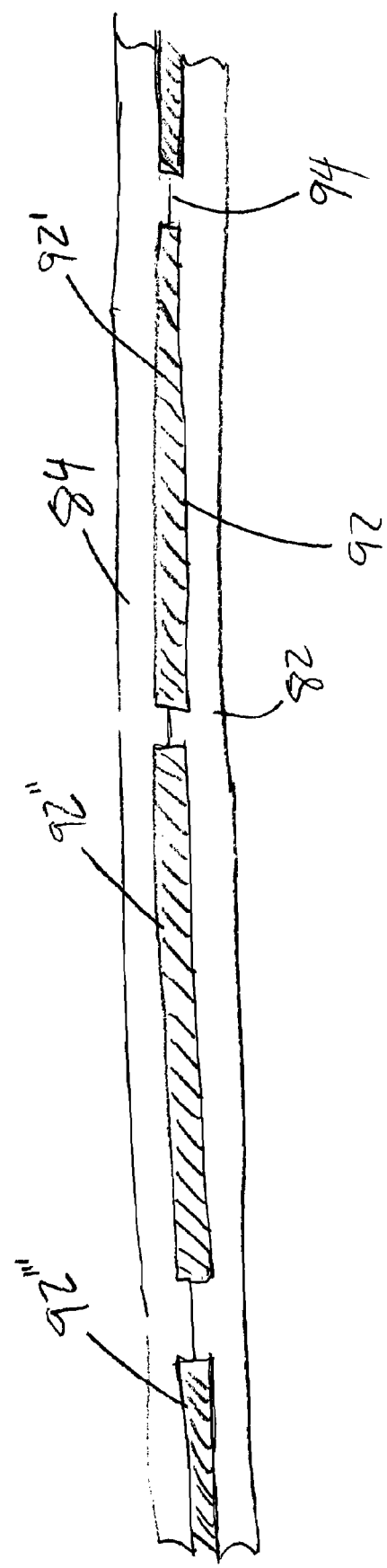
FIG. 9 shows a side cross sectional view of a string of photovoltaic cells between top and bottom laminating sheets after proceeding through a laminating apparatus.

In step S9, the first string of photovoltaic cells 92' which are electrically connected in series are laminated between a top (or second) laminating sheet 84 and a bottom (or first) laminating sheet 82 as shown in FIG. 9, using a laminating apparatus 86 shown in FIG. 2. The top laminating sheet and/or web 84 from a second laminating spool or roll 90 shown in FIG. 2 is provided over the first string of photovoltaic cells 92' which are electrically connected in series as shown in FIG. 9. The string of photovoltaic cells 92 may be a series of photovoltaic cells 24 that are electrically connected to each other through intervening interconnects 60 as shown in FIG. 8. The first string of photovoltaic cells 92' which are electrically connected in series between the top laminating sheet and the bottom laminating sheet are then laminated in the laminating apparatus 86 to laminate the first string of photovoltaic cells 92' between the bottom and top (or first and second) laminating sheets 82 and 84 to form a flexible photovoltaic device. The laminating apparatus 86 may provide an adhesive between the top and bottom laminating sheets so that they adhere to each other. Any suitable adhesive material, such as a thermoplastic adhesive, UV curable adhesive, a pressure sensitive adhesive, etc., may be used. The adhesive material coating may be applied to the top and bottom laminating sheets or the strings of photovoltaic cells before the top and bottom lamination sheets contact the strings of photovoltaic cells. Thus, the first string of photovoltaic cells 92' is electrically connected in series without curling, bending or twisting either the plurality of interconnects or the plurality of photovoltaic cells in the first string, and without plating a conductive trace in a hole through each of the plurality of interconnects.

In step S10, the lamination process may be continued for subsequent strings of photovoltaic cells, i.e., for another series of photovoltaic cells 92' that are electrically connected to each other through intervening interconnects but are not electrically connected to any other string of photovoltaic cells (as seen in FIG. 9). For example, a second or subsequent string of photovoltaic cells 92" which are electrically connected in series may be laminated between the top laminating sheet 84 and the bottom laminating sheet 82 such that the top laminating sheet 84 contacts the bottom laminating sheet 82 in a space 94 between the first and the second strings of photovoltaic cells 92' and 92". A further string of photovoltaic cells, such as string 92''' may follow the second string 92" in which the top laminating sheet 84 contacts the bottom laminating sheet 82 in a space 94' between the second and the third strings of photovoltaic cells 92' and 92'''. Any suitable number of strings may be formed in this manner, such as 1, 5, 10, 20, 50, 100 or more, or any integer therebetween as shown in FIG. 9.

In step S11, the laminated first and second strings of photovoltaic cells 92' and 92" (and any further strings that may be desired) may be rolled onto a take up spool 96 so as to form a flexible photovoltaic device roll. The bottom and the top laminating sheets 82 and 84 may be cut in the space 94 between the first and the second strings of photovoltaic cells 92' and 92" (or between any adjacent strings) to separate the laminated first and the second strings of photovoltaic cells after unrolling the photovoltaic device roll (in a subsequent process step).

Figure 10:
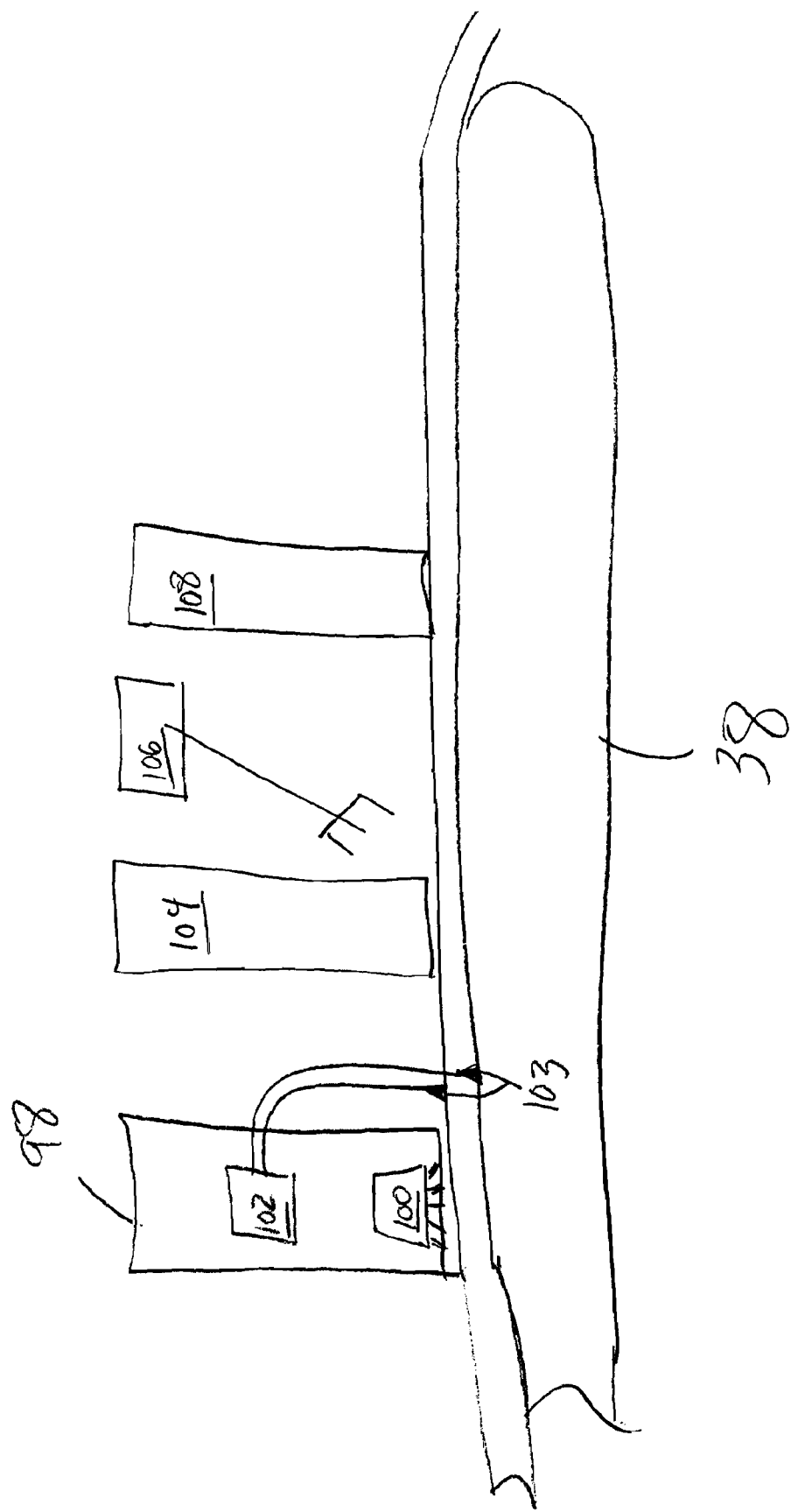
FIG. 10 shows a side view of another embodiment of the system which utilizes an electrical testing apparatus.

Optionally, an electrical testing apparatus 98 may be located adjacent to the second conveyor 38. The electrical testing apparatus 98 may be configured to electrically test the first string of photovoltaic cells 92' either after step S8, step S9, or step S10. FIG. 10 shows an embodiment of the system which utilizes the electrical testing apparatus 98 after the laminating apparatus 86 of FIG. 2. In this embodiment of FIG. 10, the electrical testing takes place between steps S10 and S11 (in FIG. 1). The step of electrically testing the plurality of strings comprises exposing each of the plurality of strings to a flash of light from a light source 100 (such as a light bulb, LED, LCD, or any other suitable source) and monitoring a current or voltage between the second conveyor 38 and an interconnect in the string exposed to the flash of light using a current or voltage monitoring device 102 with contacts 103 mounted on a movable structure, such as robot arms or retractable pistons.

If one or more of the plurality of strings is not determined to be within a predetermined level of suitability (for example, the measured current or voltage being below a predetermined threshold or range), the unsuitable string(s) which do not meet the predetermined level of suitability are removed using a cutting apparatus 104 which cuts out unsuitable strings, and robot arm 106 with a vacuum head or other suitable pickup device, which removes the unsuitable strings. The plurality of strings remaining after removing the unsuitable string(s) are reintegrated by using a splicing reattachment apparatus 108 such that the plurality of the remaining strings are moving while being spaced apart (e.g., equidistant or non-equidistant) from each other. An example of the splicing reattachment device 108 may be a device that aligns cut ends of adjacent strings and remelts the top and bottom laminating sheets so that the cut ends are joined together.

The process and various apparatus components described above may be controlled by a controller 110 shown in FIG. 2 which is electrically connected (e.g., wired or wirelessly) to the various components. The controller 110 may be any suitable general or specific purpose computer or a dedicated control chip, circuit, or device, such as an ASIC, with the necessary software and/or hardware and connections necessary to carry out the processes described herein. The controller may be contained within a single housing or multiple housings (for example, particular controller components may be located within the devices which they control).

With the above methods and systems for making a photovoltaic device, the resulting photovoltaic device formed thereby may comprise a flexible photovoltaic device roll comprising at least a first string of photovoltaic cells 92' which are electrically connected in series and a second string of photovoltaic cells 92" which are electrically connected in series between a top laminating sheet 84 and a bottom laminating sheet 82 such that the top laminating sheet contacts the bottom laminating sheet in a space 94 between the first and the second strings of photovoltaic cells 92' and 92".

The installation of the photovoltaic device may comprise the step of providing the flexible photovoltaic device roll. The flexible photovoltaic device may comprise at least a first string of photovoltaic cells 92' which are electrically connected in series and a second string of photovoltaic cells 92" which are electrically connected in series between a top laminating sheet 84 and a bottom laminating sheet 82 such that the top laminating sheet 84 contacts the bottom laminating sheet 82 in a space 94 between the first and the second strings of photovoltaic cells 92' and 92". The flexible photovoltaic device roll is unrolled. Then the unrolled flexible photovoltaic device roll is cut in the space 94 between the first and the second strings. The first string 92' laminated between the top and bottom laminated sheets 84 and 82 is installed in a first location, and the second string 92" laminated between the top and bottom laminated sheets 84 and 82 is separately installed in a second location. The first location may comprise a first portion 152 of a roof 150 and the second location may comprise a second portion 154 of the roof 150, as shown in FIG. 15.

Figure 11:
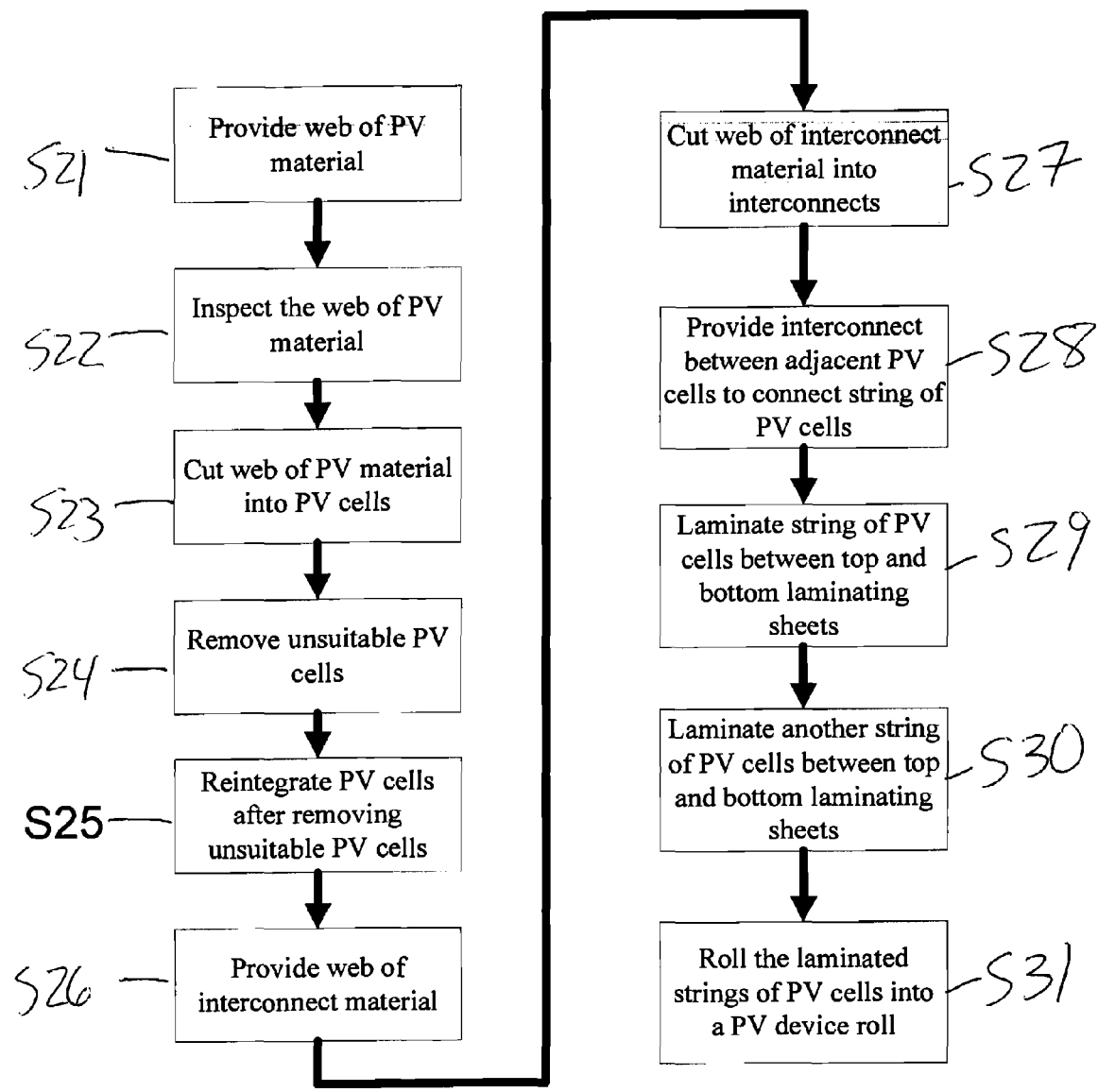
FIG. 11 is a flow chart showing a process for making a photovoltaic device according to another embodiment of the present invention.
Figure 12:
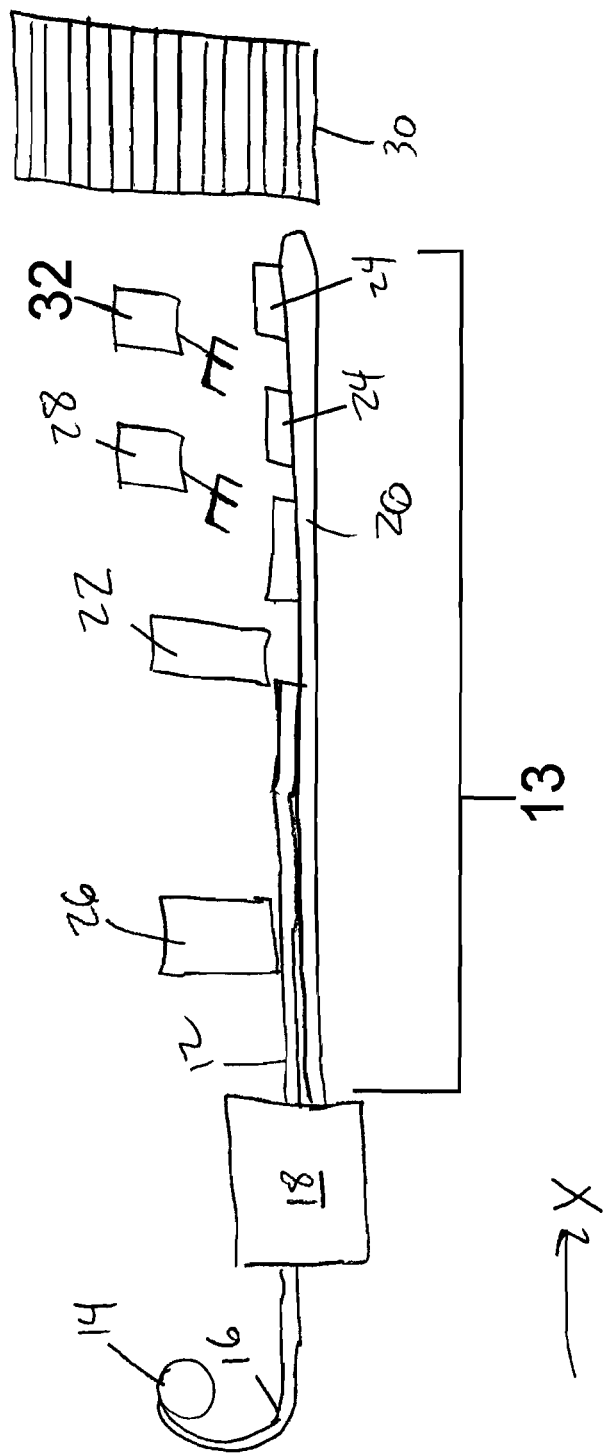
FIG. 12 is a schematic diagram of a portion of the system for making a photovoltaic device according to another embodiment of the present invention.

FIG. 11 shows a flow chart showing the process for making a photovoltaic ("PV") device according to another embodiment of the present invention while FIG. 12 shows a portion of the system used for making the PV device. This process is the same as the one described above with respect to FIGS. 1 and 2, except that the inspection step precedes the web cutting step. Thus, the inspection apparatus 26 is located "upstream" or before from the cutting apparatus 22 in FIG. 12. In contrast, the position of apparatus 22 and 26 in FIG. 2 is reversed. The process or method may comprise the step of providing a web of photovoltaic material 12 in step S21. To provide the web of photovoltaic material 12, a substrate web spool 14 is configured to a provide a flexible substrate web 16 into at least one photovoltaic material deposition chamber 18. The at least one photovoltaic material deposition chamber 18 is located between the substrate web spool 14 and an input end of a first conveyor 20. P-type and n-type photovoltaic material and at least one electrode are deposited onto the moving substrate web 16 in the at least one deposition chamber 18. The web of photovoltaic material 12 resulting from the process is then placed on the first conveyor 20 configured to convey web of photovoltaic material along a first section 13 of the system.

In step S22, the web of photovoltaic material 12 is inspected by an inspection apparatus 26, which may be similar to the inspection apparatus of FIG. 2. It is then determined if the inspected portions of the web of photovoltaic material meet a predetermined level of suitability. Thus, in the method of FIGS. 11 and 12 the PV web 12 rather than cut PV cells 24 are inspected.

In step S23, the web of photovoltaic material 12 is moved from the at least one deposition chamber 18 in a first direction X, such that the moving web of photovoltaic material 12 is cut into the plurality of photovoltaic cells 24 using a cutting device 22, which may be similar to the cutting device 22 of FIG. 2.

In step S24, the unsuitable photovoltaic cells which were formed from portions of the web of photovoltaic material and that did not meet the predetermined level of suitability (as determined by the inspection apparatus 26 in step S22) are removed using a removal apparatus 28, which may be similar to the removal apparatus 28 of FIG. 2.

In step S25, the plurality of photovoltaic cells 24 that are determined by the inspection apparatus 26 to be suitable are reintegrated after removing the unsuitable photovoltaic cells such that the plurality of remaining photovoltaic cells are moving while being spaced apart (e.g., equidistant or non-equidistant) from each other. The reintegration of photovoltaic cells 24 may be carried out by individually stacking the plurality of suitable photovoltaic cells 24 into a sorter 30. The mechanism for stacking the photovoltaic cells 24 into the sorter 30 may be the removal apparatus 28 or a separate moving apparatus 32 that may be similar or different in nature from the removal apparatus 28. The sorter 30 may be similar to the sorter of FIG. 2. The remaining steps S26-S31 of FIG. 11 are similar to steps S6-S11 of FIG. 1, respectively, and the remaining components of the system of FIG. 12 are similar to those components after the sorter 30 described and depicted in FIG. 2.

In another alternative embodiment, one or more inspection steps (e.g., S3-S5 or S23-S25) may be conducted after steps S7 and S27 in FIGS. 1 and 11, respectively. For example, an optical and/or electrical inspection apparatus described above may be used to inspect at least one of the PV cells 24 located over the conveyor 38 and the interconnects 60 which are approaching or located over the conveyor 38. The unsuitable PV cells 24 and/or interconnects 60 are removed by a removal apparatus described above. The suitable PV cells and/or interconnects are then reintegrated and the suitable interconnects 60 are placed between suitable PV cells 24 as described above in steps S8 and S28 with respect to FIGS. 1 and 11, respectively. If both PV cells 24 and interconnects 60 are inspected, then the same or different inspection apparatus may be used, and the PV cells 24 and interconnects 60 may be inspected at the same time.

Figure 13:
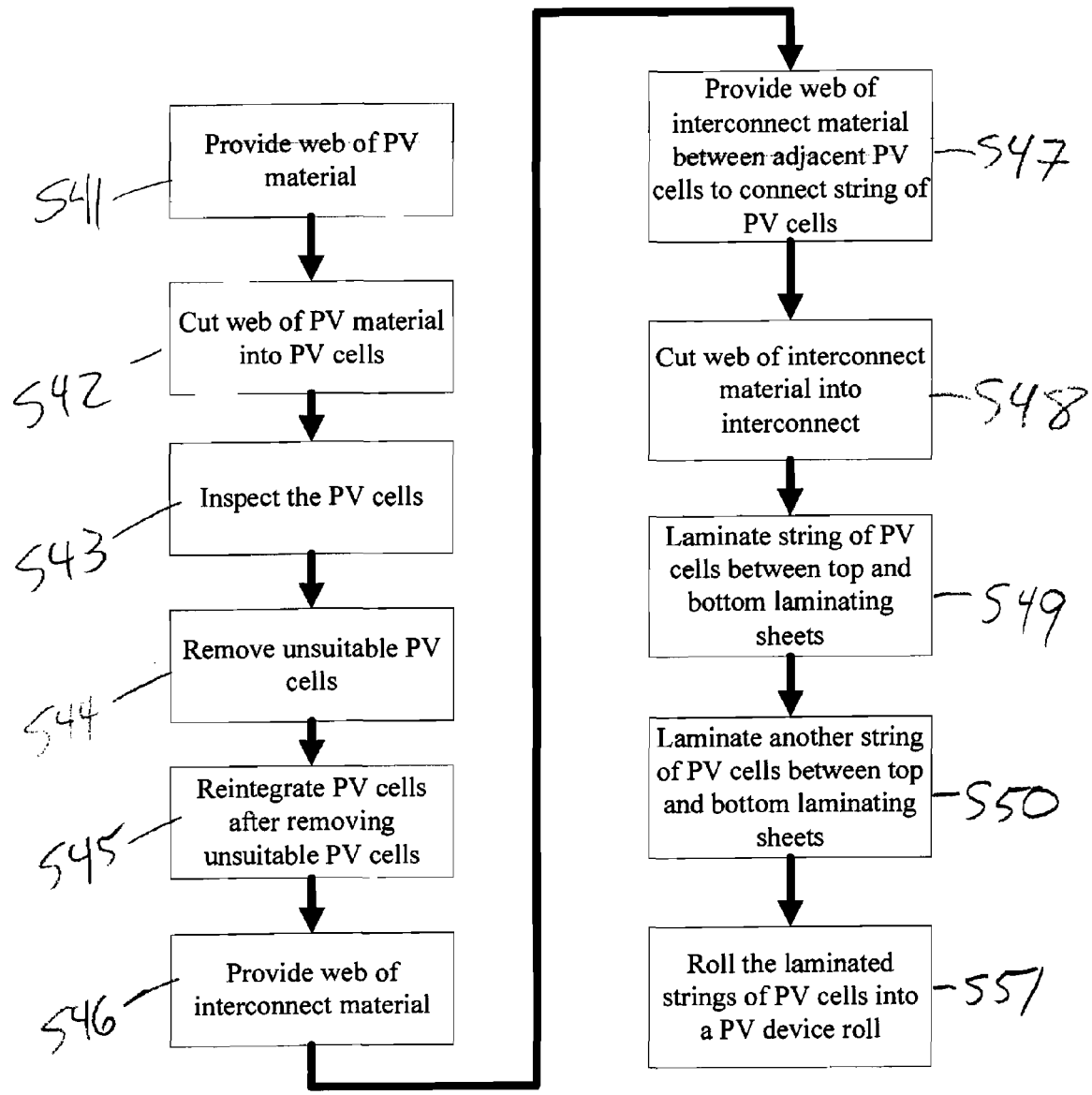
FIG. 13 is a flow chart showing a process for making a photovoltaic device according to another embodiment of the present invention.

FIG. 13 shows a flow chart showing the process for making a photovoltaic ("PV") device according to another embodiment of the present invention while FIGS. 14(*a*)-14(*c*) show the operation of a portion of the system used for making the PV device. The process steps S41-S45 and S49-S51 are similar to steps S1-S5 and S9-S11 of FIG. 1, respectively, and will not be described again below. In the method of FIGS. 13 and 14, a web of interconnect material 46 is placed over the PV cells 24 followed by cutting the web 46 into interconnects 60. In contrast, in the method of FIGS. 1 and 2, the web 46 is first cut into interconnects 60 and the discrete interconnects are then placed over the PV cells 24.

In step S46 and shown in FIG. 14(*a*), the second conveyor 38 is moved in the first direction X such that the first photovoltaic cell 24' located on the second conveyor 38 moves in the first direction X while the web of interconnect material 46 is moved in the second direction Z which is substantially perpendicular to the first direction X, such that the web of interconnect material 46 is located over the upper electrode of the first photovoltaic cell 24' located on the second conveyor 38. The movement of the web of interconnect material 46 in the second direction Z comprises unrolling the web of interconnect material 46 from a roll 68 in the second direction Z.

In step S47 and shown in FIG. 14(*b*), a step of placing the second photovoltaic cell 24" onto the first interconnect 60 to be formed by the web of interconnect material 46 comprises placing the second photovoltaic cell 24" onto the trailing portion of the wire segment of the web 46 before the step of cutting the web of interconnect material 46 by the cutting device 70 (shown in FIG. 2) to form the first interconnect 60.

In step S48 and shown in FIG. 14(*c*), the web of interconnect material 46 is cut by the cutting device 70 such that the first interconnect 60 is formed which has the leading portion of the wire segment contacting the upper electrode of the first photovoltaic cell 24' and having the trailing portion of the wire segment contacting the lower electrode of the second photovoltaic cell 24". While square or rectangular interconnects 60 are illustrated, it should be noted that the interconnects 60 may have any other suitable shape. Only portions of the continuous web 46 are cut out to form interconnects 60 without disrupting the continuity of the web 46 in FIG. 14. Alternatively, interconnects 60 may comprise the whole width of the web 46 such that the web 46 is completely severed during the cutting of the interconnect. Tension rollers may be provided to pull the severed web 46 over the conveyor 38.

The remaining components of the system of FIG. 14 (not shown) are similar to those described and depicted in FIG. 2.

Besides those embodiments depicted in the figures and described in the above description, other embodiments of the present invention are also contemplated. For example, any single feature of one embodiment of the present invention may be used in any other embodiment of the present invention.

It is important to note that the construction and arrangement of system for making the photovoltaic device as shown in the various exemplary embodiments is illustrative only. Although only a few embodiments have been described in detail in this disclosure, those skilled in the art who review this disclosure will readily appreciate that many modifications are possible (e.g., placements of components, variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. The process steps may be run concurrently or consecutively with other process steps. Other substitutions, modifications, changes and omissions may also be made in the design, operating conditions and arrangement of the various exemplary embodiments without departing from the scope of the present invention.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

What is claimed is:

1. A method of making a photovoltaic device, comprising:
providing a web of photovoltaic material including depositing p-type and n-type photovoltaic material and at least one electrode onto a moving substrate web in at least one deposition chamber to provide the web of photovoltaic material;
providing a web of interconnect material comprising a conductor supported by an insulating carrier;
cutting the web of photovoltaic material into a plurality of photovoltaic cells;
cutting the web of interconnect material into a plurality of interconnects;
providing a respective one of the plurality of interconnects between adjacent photovoltaic cells to electrically connect a first string of photovoltaic cells in series; and
laminating the first string of photovoltaic cells which are electrically connected in series between a top laminating sheet and a bottom laminating sheet.

2. The method of claim 1, further comprising:
moving the web of photovoltaic material from the at least one deposition chamber in a first direction, such that the step of cutting the web of photovoltaic material comprises cutting the
moving web of photovoltaic material into the plurality of photovoltaic cells; inspecting the plurality of moving photovoltaic cells;
removing unsuitable photovoltaic cells which do not meet a predetermined level of suitability; and
reintegrating the plurality of photovoltaic cells after removing the unsuitable photovoltaic cells.

3. The method of claim 2, wherein the step of reintegrating comprises individually stacking the plurality of photovoltaic cells into a sorter and providing individual photovoltaic cells from the sorter onto a conveyor such that the plurality of the photovoltaic cells are spaced apart from each other on the conveyor.

4. The method of claim 3, wherein the step of providing the respective one of the plurality of interconnects comprises:
placing a first photovoltaic cell on the conveyor;
placing a first interconnect such that the conductor of the first interconnect contacts an upper electrode of the first photovoltaic cell located on the conveyor;
pressing the first interconnect against the first photovoltaic cell; and placing a second photovoltaic cell onto the first interconnect such that the conductor of the first interconnect contacts a lower electrode of the second photovoltaic cell.

5. The method of claim 1, further comprising:
depositing p-type and n-type photovoltaic material and at least one electrode onto a moving substrate web in at least one deposition chamber to provide the web of photovoltaic material;
inspecting the web of photovoltaic material;
determining if inspected portions of the web of photovoltaic material do not meet a predetermined level of suitability;
moving the web of photovoltaic material from the at least one deposition chamber in a first direction, such that the step of cutting the web of photovoltaic material comprises cutting the moving web of photovoltaic material into the plurality of photovoltaic cells;
removing unsuitable photovoltaic cells which were formed on portions of the web of photovoltaic material which did not meet the predetermined level of suitability; and
reintegrating the plurality of photovoltaic cells after removing the unsuitable photovoltaic cells.

6. The method of claim 1, wherein:
the conductor comprises a conductive wire;
the web of interconnect material comprises a web of the insulating carrier supporting the conductive wire;
the conductive wire comprises a plurality of repeating, discrete wire segments which are separated from each other in a movement direction of the insulating carrier web; and
a first end of each wire segment is located adjacent to a first edge of the insulating carrier web and a second end of each wire segment is located adjacent to a second edge of the insulating carrier web.

7. The method of claim 6, wherein:
each interconnect comprises one of the plurality of repeating, discrete wire segments;
each wire segment having a leading and a trailing portion;
the leading portion of the wire segment is exposed below a bottom surface of the insulating carrier web; and the trailing portion of the wire segment is exposed above a top surface of the insulating carrier web.

8. The method of claim 7, wherein each wire segment comprises a continuous serpentine wire which extends a plurality of times from the bottom surface to the top surface of the insulating carrier web through the insulating carrier web.

9. The method of claim 7, wherein each wire segment comprises a wire mesh, one or more curved wires or a plurality of straight wires.

10. The method of claim 7, wherein the step of providing the respective one of the plurality of interconnects comprises:
placing a first photovoltaic cell on a conveyor;
placing a first interconnect such that the leading portion of the wire segment of the first interconnect contacts an upper electrode of the first photovoltaic cell located on the conveyor; and placing a second photovoltaic cell onto the first interconnect such that the trailing portion of the wire segment of the first interconnect contacts a lower electrode of the second photovoltaic cell.

11. The method of claim 10, further comprising:
moving the conveyor in a first direction such that the first photovoltaic cell located on the conveyor moves in the first direction; and
moving the web of interconnect material in a second direction which is substantially perpendicular to the first direction, such that the web of interconnect material is located over the upper electrode of the first photovoltaic cell located on the conveyor.

12. The method of claim 11, wherein:
the step of moving the web of interconnect material in the second direction comprises unrolling the web of interconnect material from a roll in the second direction;
the step of cutting the web of interconnect material forms the first interconnect having the leading portion of the wire segment contacting the upper electrode of the first photovoltaic cell located on the conveyor; and
the step of placing the second photovoltaic cell onto the first interconnect comprises placing the second photovoltaic cell onto the trailing portion of the wire segment before or after the step of the step of cutting the web of interconnect material to form the first interconnect.

13. The method of claim 1, wherein the conductor comprises a printed or plated trace electrode.

14. The method of claim 1, wherein the step of laminating comprises:
providing the bottom laminating sheet from a first roll on a conveyor under the plurality of photovoltaic cells;
providing the top laminating sheet from a second roll over the first string of photovoltaic cells which are electrically connected in series; and
laminating the first string of photovoltaic cells which are electrically connected in series between the top laminating sheet and the bottom laminating sheet.

15. The method of claim 14, further comprising laminating a second string of photovoltaic cells which are electrically connected in series between the top laminating sheet and the bottom laminating sheet such that the first laminating sheet contacts the second laminating sheet in a space between the first and the second strings of photovoltaic cells.

16. The method of claim 15, further comprising rolling the laminated first and second strings of photovoltaic cells into a flexible photovoltaic device roll, such that the first and the second laminating sheets may be cut in the space between the first and the second strings of photovoltaic cells to separate the laminated first and the second strings of photovoltaic cells after unrolling the photovoltaic device roll.

17. The method of claim 1, wherein the first string of photovoltaic cells is electrically connected in series without curling, bending or twisting either the plurality of interconnects or the plurality of photovoltaic cells in the first string, and without plating a conductive trace in a hole through each of the plurality of interconnects.

\* \* \* \* \*